U S009401210B2

United States Patent
Kwon et al.

(10) Patent No.: US 9,401,210 B2
(45) Date of Patent: Jul. 26, 2016

(54) NONVOLATILE MEMORY DEVICE AND PROGRAMMING METHOD THEREOF INCLUDING COMMON SOURCE LINE FEEDBACK DURING PROGRAM AND VERIFICATION OPERATION

(71) Applicants: Tae-Hong Kwon, Seoul (KR); Doogon Kim, Hwaseong-si (KR)

(72) Inventors: Tae-Hong Kwon, Seoul (KR); Doogon Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/607,857

(22) Filed: Jan. 28, 2015

(65) Prior Publication Data
US 2015/0332771 A1 Nov. 19, 2015

(30) Foreign Application Priority Data
May 13, 2014 (KR) .......................... 10-2014-0057310

(51) Int. Cl.
G11C 16/04 (2006.01)
G11C 16/10 (2006.01)
G11C 16/08 (2006.01)
G11C 16/34 (2006.01)
G11C 16/16 (2006.01)

(52) U.S. Cl.
CPC ............ *G11C 16/10* (2013.01); *G11C 16/0483* (2013.01); *G11C 16/08* (2013.01); *G11C 16/3459* (2013.01); *G11C 16/16* (2013.01)

(58) Field of Classification Search
CPC ......... G11C 16/08; G11C 16/10; G11C 16/16

USPC .......................... 365/185.11, 185.25, 185.26
See application file for complete search history.

(56) References Cited

U.S. PATENT DOCUMENTS

| 5,812,490 | A | * | 9/1998 | Tsukude | ................... | G11C 7/22 |
| | | | | | | 365/189.05 |
| 5,894,448 | A | * | 4/1999 | Amano | ................... | G11C 5/063 |
| | | | | | | 365/230.03 |
| 6,717,861 | B2 | | 4/2004 | Jeong et al. | | |
| 6,940,758 | B2 | | 9/2005 | Chung | | |
| 7,529,126 | B2 | | 5/2009 | Tanaka et al. | | |
| 7,835,181 | B2 | | 11/2010 | Maejima et al. | | |
| 8,154,929 | B2 | | 4/2012 | Kang | | |
| 8,675,410 | B2 | | 3/2014 | Pyeon et al. | | |
| 2011/0058427 | A1 | * | 3/2011 | Choi | .................. | G11C 16/0483 |
| | | | | | | 365/185.25 |
| 2013/0272067 | A1 | | 10/2013 | Lee et al. | | |
| 2013/0279255 | A1 | | 10/2013 | Kamata et al. | | |

FOREIGN PATENT DOCUMENTS

JP 2003-204000 A 7/2003

* cited by examiner

*Primary Examiner* — Connie Yoha
(74) *Attorney, Agent, or Firm* — Volentine & Whitt, PLLC

(57) ABSTRACT

A nonvolatile memory device includes a memory cell array, an address decoder, an input/output circuit, a CSL driver, and control logic. The memory cell array includes a plurality of memory blocks each having a plurality of strings that are formed in a direction perpendicular to a substrate and are connected between bit lines and a common source line. The CSL driver sets up the common source line with a predetermined voltage and supplies or drains charge to or from the common source line using a voltage level of the common source line as a feedback signal.

18 Claims, 16 Drawing Sheets

… (1) …

NONVOLATILE MEMORY DEVICE AND PROGRAMMING METHOD THEREOF INCLUDING COMMON SOURCE LINE FEEDBACK DURING PROGRAM AND VERIFICATION OPERATION

CROSS-REFERENCE TO RELATED APPLICATIONS

A claim for priority under 35 U.S.C. §119 is made to Korean Patent Application No. 10-2014-0057310 filed May 13, 2014, in the Korean Intellectual Property Office, the entire contents of which are hereby incorporated by reference.

BACKGROUND

The inventive concepts described herein relate to a nonvolatile memory device and a programming method thereof.

Semiconductor memory devices are classified into volatile semiconductor memory devices and nonvolatile semiconductor memory devices. The nonvolatile semiconductor memory devices retain data stored therein even at power-off; data stored in the nonvolatile semiconductor memory device is permanent or reprogrammable, depending upon the fabrication technology used. The nonvolatile semiconductor memory devices are used for user data storage and program and microcode storage in a wide variety of applications: computers, avionics, telecommunications, and consumer electronics industries.

As a nonvolatile memory, a floating gate type flash memory is widely used which is configured to store bit information by injecting charge in a floating gate made up of polysilicon. The flash memory may be configured to include single level cells (SLCs each of which stores one of two states (e.g., 1 and 0) or multi-level cells (MLCs) each of which stores one of four states (e.g., 11, 01, 00, and 10).

Coupling arises between a common source line and a line (e.g., a bit line) adjacent thereto at a programming operation of the flash memory, thereby causing an unintended variation in a level of the common source line.

SUMMARY

One aspect of embodiments of the inventive concept is directed to a nonvolatile memory device which comprises a memory cell array, an address decoder, an input/output circuit, a CSL driver, and control logic. The memory cell array includes a plurality of memory blocks each having a plurality of strings that are formed in a direction perpendicular to a substrate and are connected between bit lines and a common source line.

The address decoder is adapted to select one of the plurality of memory blocks in response to an address.

The input/output circuit is adapted to store data to be programmed at memory cells connected to a selected one of word lines of the selected memory block at a program operation or store data read from the memory cells connected to the selected word line at a verification operation. The CSL driver is adapted to set the common source line with a predetermined voltage and drain or supply charge from or to the common source line using a voltage level of the common source line as a feedback signal. The control logic is adapted to control the address decoder, the input/output circuit, and the CSL driver at the program and the verification operation.

The CSL driver supplies or drains charge to or from the common source line as much as a difference between the predetermined voltage and a voltage level of the common source line. The CSL driver comprises: a differential amplifier adapted to amplify a reference voltage to adjust a voltage level of the common source line; and a common source line level control unit including a pull-up unit adapted to supply charge to the common source line and a pull-down unit adapted to drain charge from the common source line. An output terminal of the differential amplifier is electrically connected to the common source line.

The pull-up unit comprises a first enable transistor and a first control transistor connected in series between a second voltage node, supplied with a second voltage, and the common source line, and the pull-down unit comprises a second enable transistor and a second control transistor connected in series between the common source line and a ground. The common source line driver further comprises an amplification circuit electrically connected between the differential amplifier and the common source line level control unit and adapted to control operations of the pull-up and pull-down units.

The amplification circuit turns off at least one of the pull-up unit and the pull-down unit. The amplification circuit comprises: a first transistor string first to fourth transistors connected in series between a first voltage node, supplied with a first voltage, and a ground; and a second transistor string fifth to eighth transistors connected in series between the second voltage node and the ground. The first and second transistors have the same resistance value, the second and sixth transistors have the same resistance value, the fourth and eighth transistors have the same resistance value, and the third and seventh transistors have different resistance values. A gate of the first control transistor is connected to a node between the second and third transistors, and a gate of the second control transistor is connected to a node between the sixth and seventh transistors.

The common source line driver further comprises: a ramping code generator adapted to generate a set code for stepwise increasing or decreasing a voltage level of the common source line; and a first reference voltage generator adapted to output the reference voltage corresponding to the set code. The common source line driver stepwise decreases a voltage level of the common source line during a common source line recovery period. The common source line recovery period is equal to or shorter than about 4 μs after a program execution period.

Another aspect of embodiments of the inventive concept is directed to a method of programming a nonvolatile memory device which includes a plurality of strings formed between bit lines and a common source line in a direction perpendicular to a substrate, the method comprising: setting up the common source line with a predetermined voltage; supplying or draining charge to or from the common source line using a voltage level of the common source line as a feedback signal; programming memory cells connected to a selected word line; and performing a verification operation about the memory cells.

Supplying or draining charge to or from the common source line using a voltage level of the common source line as a feedback signal comprises: determining whether a voltage level of the common source line varies; as a consequence of determining that a voltage level of the common source line varies, determining whether a voltage level of the common source line is higher than a predetermined voltage; draining charge from the common source line when a voltage level of the common source line is higher than the predetermined voltage; and supplying charge to the common source line when a voltage level of the common source line is lower than the predetermined voltage.

Supplying or draining charge to or from the common source line using a voltage level of the common source line as a feedback signal further comprises: maintaining a voltage level of the common source line when a voltage level of the common source line does not vary; and determining whether programming the memory cells is ended. The verification operation is performed when programming the memory cells is ended and whether a voltage level of the common source line varies is determined when programming the memory cells is not ended.

With embodiments of the inventive concept, a voltage level of a common source line CSL is constantly maintained by supplying or draining charge to or from the common source line using a voltage level of the common source line as a feedback signal, thereby making it possible to reduce the bit line coupling and to prevent disturbance of a threshold voltage distribution of memory cells of an unselected block.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
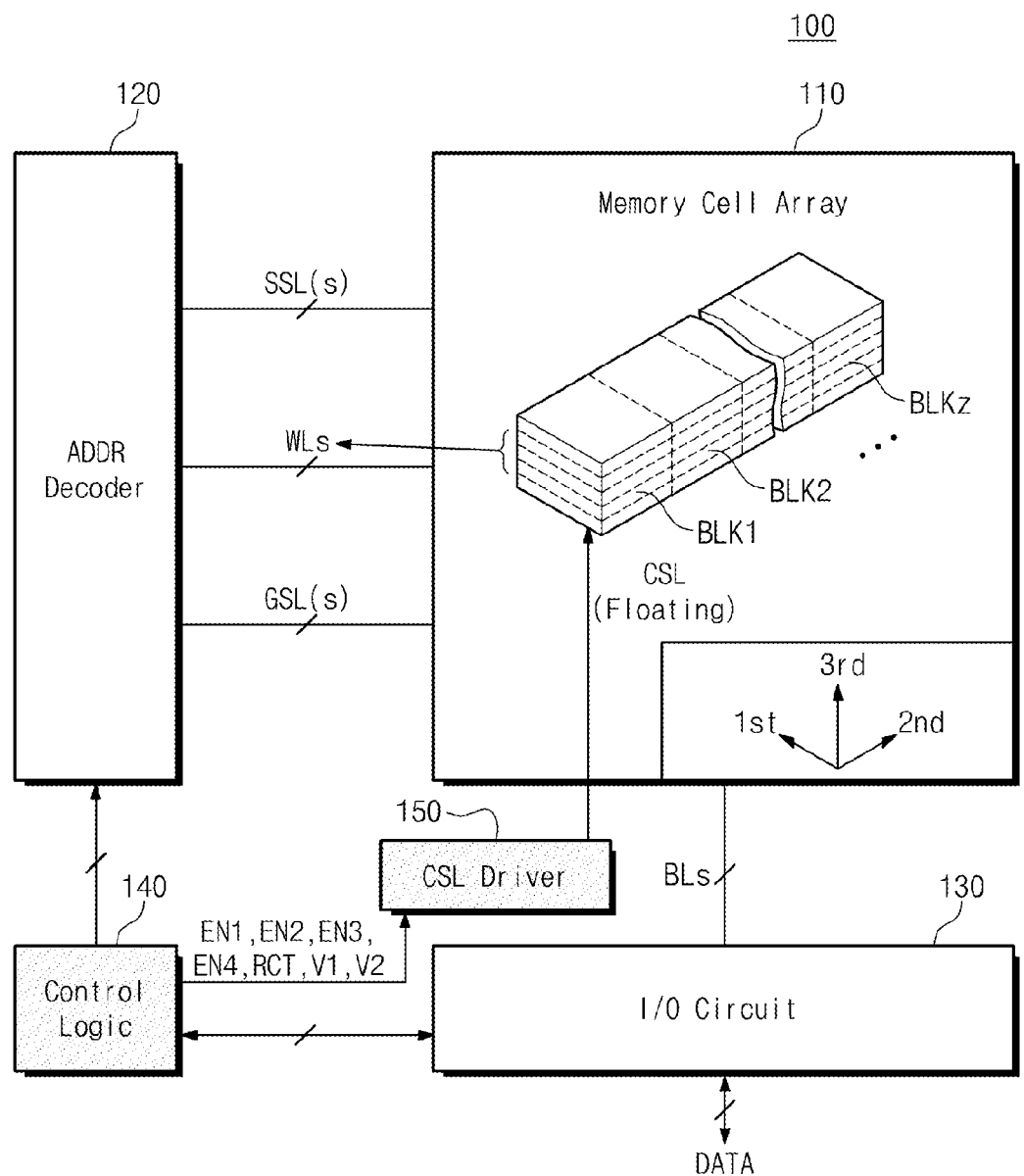
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device according to an embodiment of the inventive concept. Referring to FIG. 1, a nonvolatile memory device 100 includes a memory cell array 110, an address decoder 120, an input/output circuit 130, control logic 140, and a common source line (CSL) driver 150. The nonvolatile memory device 100 may be formed of, but not limited to, a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device.

Also, the nonvolatile memory device 100 may be implemented to have a three-dimensional array structure. Not only is the inventive concept applicable to a flash memory device, in which a charge storage layer is made up of a conductive floating gate, but it is also applicable to a Charge Trap Flash (CTF) memory device, in which a charge storage layer is made up of an insulation film. Below, the nonvolatile memory device 100 is referred to as a vertical NAND flash memory device (VNAND).

The memory cell array 110 includes a plurality of memory blocks BLK1 to BLKz (z being an integer of 2 or more), each of which is connected to the address decoder 120 via word lines, at least one string selection line SSL, and at least one ground selection line GSL and to the input/output circuit 130 via bit lines. In exemplary embodiments, the word lines may be formed to have a shape in which plates are stacked.

The memory blocks BLK1 to BLKz may include a plurality of strings that are three-dimensionally arranged on a substrate along a first direction and a second direction different from the first direction and along a third direction (i.e., a direction perpendicular to a plane formed in the first and second directions). Herein, each string may contain at least one string selection transistor, a plurality of memory cells, and at least one ground selection transistor that are connected in series in a direction perpendicular to the substrate. Each memory cell may store at least one bit. In exemplary embodiments, at least one dummy cell may be provided between at least one string selection transistor and a plurality of memory cells. As another example, at least one dummy cell may be provided between a plurality of memory cells and at least one ground selection transistor.

The address decoder 120 selects one of the memory blocks BLK1 to BLKz in response to an address. The address decoder 120 is connected to the memory cell array 110 through the word lines, the at least one string selection line SSL, and the at least one ground selection line GSL. The address decoder 120 selects the word lines, the at least one string selection line SSL, and the at least one ground selection line GSL using a decoded row address. The address decoder 120 decodes a column address of an input address. Herein, the decoded column address may be transferred to the input/output circuit 130. In exemplary embodiments, the address decoder 120 may include, but not limited to, a row decoder, a column decoder, an address buffer, and so on.

The input/output circuit 130 is connected to the memory cell array 110 through the bit lines. The input/output circuit 130 is configured to receive the decoded column address from the address decoder 120. The input/output circuit 130 selects the bit lines using the decoded column address. The input/output circuit 130 stores program data from an external device (e.g., a memory controller) in the memory cell array 110, and it reads data from the memory cell array 110 to output it to the external device. Meanwhile, the input/output circuit 130 reads data from a first area of the memory cell array 110 and then stores the read data in a second area of the memory cell array 110. For example, the input/output circuit 140 is configured to perform a copy-back operation.

The control logic 140 controls an overall operation of the nonvolatile memory device 100, including, but not limited to, a program operation, a read operation, an erase operation, and so on. The control logic 140 operates in response to control signals or commands that are provided from the external device. In exemplary embodiments, the control logic 140 generates CSL control signal EN1, EN2, EN3, and EN4 and a ramping control signal RCT for controlling the CSL driver 150. Herein, the CSL control signals EN1 to EN4 and the ramping control signal RCT may be generated according to environment information such as a CSL level, a temperature of the memory cell array 110, an operation mode, the number of program loops, a time, and so on. The control logic 140 also generates a first voltage V1 and a second voltage V2.

The CSL driver 150 receives the first and second voltages V1 and V2 and provides a common source line CSL with a predetermined voltage. The CSL driver 150 drains or supplies charge from or to the common source line CSL as much as a difference between the predetermined voltage and a voltage of the common source line CSL, that is, a voltage variation.

Figure 2:
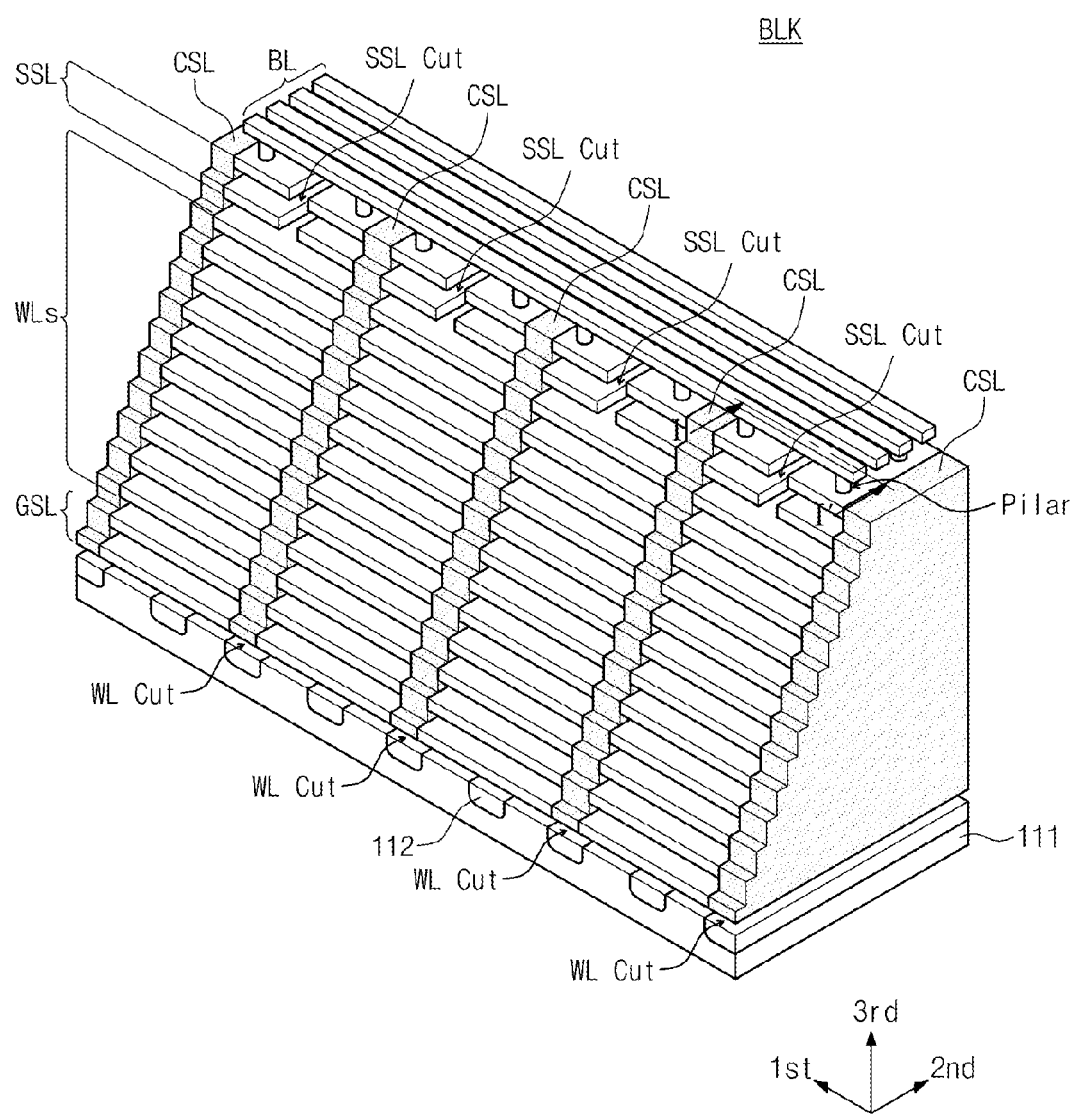
FIG. 2 is a perspective view of a memory block BLK shown in FIG. 1.

FIG. 2 is a perspective view of a memory block BLK shown in FIG. 1. Referring to FIG. 2, four sub blocks are formed on a substrate. Each sub block is formed by stacking and cutting at least one ground selection line GSL, a plurality of word lines, and at least one string selection line SSL on the substrate in a plate shape. A wall-shaped common source line CSL is formed in each word line cut. In exemplary embodiments, at least one plate-shaped dummy line may be formed between the ground selection line GSL and the word lines. Or, at least one plate-shaped dummy line may be formed between the word lines and the string selection line SSL.

Each word line cut may include a common source line CSL. In exemplary embodiments, the common source lines CSL included in the word line cuts may be interconnected. A string may be formed such that a pillar connected to a bit line penetrates the at least one string selection line SSL, the word lines, and the at least one ground selection line GSL.

In FIG. 2, an embodiment of the inventive concept is exemplified as a structure between word line cuts adjacent to each other is a sub block. However, the inventive concept is not limited thereto. For example, a structure between a word line cut and a string selection line cut may be defined as a sub block. The memory block BLK according to an embodiment of the inventive concept may be implemented to have a merged word line structure where two word lines are merged to one.

Figure 3:
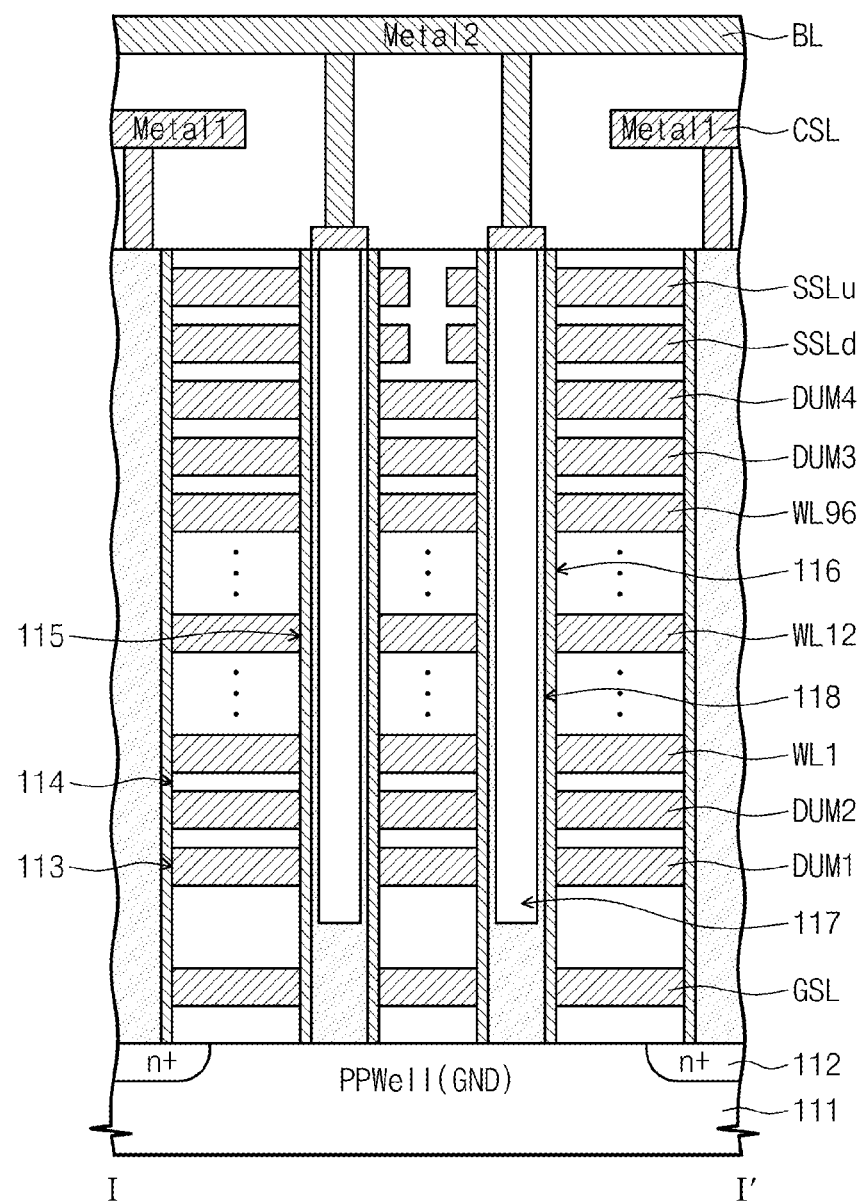
FIG. 3 is a cross-sectional view taken along a line I-I' of a memory block shown in FIG. 2.

FIG. 3 is a cross-sectional view taken along a line I-I' of a memory block shown in FIG. 2. Referring to FIG. 3, a memory block BLK is formed in a direction perpendicular to a substrate 111. An n+ doping region 112 is formed in the substrate 111. A gate electrode layer 113 and an insulation layer 114 are deposited on the substrate 111 in turn. An information storage layer 115 is formed on lateral surfaces of the gate electrode layer 113 and the insulation layer 114. The gate electrode layer 113 is connected to a ground selection line GSL, a plurality of word lines, and a string selection line.

The information storage layer 115 includes a tunnel insulation layer, a charge storage layer, and a blocking insulation layer. The tunnel insulation layer may act as an insulation layer where charge moves due to the tunneling effect. The charge storage layer may be made up of an insulation layer that traps charge. The charge storage layer may be formed of SiN or a metal (aluminum or hafnium) oxide layer. Between the gate electrode layer and the charge storage layer may act the blocking insulation layer as an insulation layer. The blocking insulation layer may be formed of a silicon oxide layer. In exemplary embodiments, the tunnel insulation layer, charge storage layer, and blocking insulation layer may constitute an ONO (Oxide-Nitride-Oxide) structure of insulation layer.

A pillar 116 is formed by vertically patterning the gate electrode layer 113 and the insulation layer 114. The pillar 116 penetrates the gate electrode layers 113 and the insulation layers 114 and is connected between a bit line and the substrate 111. The inside of the pillar 116 forms a filing dielectric pattern and is made up of an insulation material such as silicon oxide or air gap. The outside of the pillar 116 forms a vertical active pattern 118 and is made up of channel semiconductor. In exemplary embodiments, the vertical active pattern 118 is formed of a p-type silicon layer. A memory cell included in a string may be constituted of the filing dielectric pattern 117, the vertical active pattern 118, the information storage layer 115, and the gate electrode layer 113 that are disposed sequentially from the inside of the pillar 116.

Common source lines CSL extend on the n+ doping regions 112. The common source lines CSL may be included in word line cuts in a wall shape.

Figure 4:
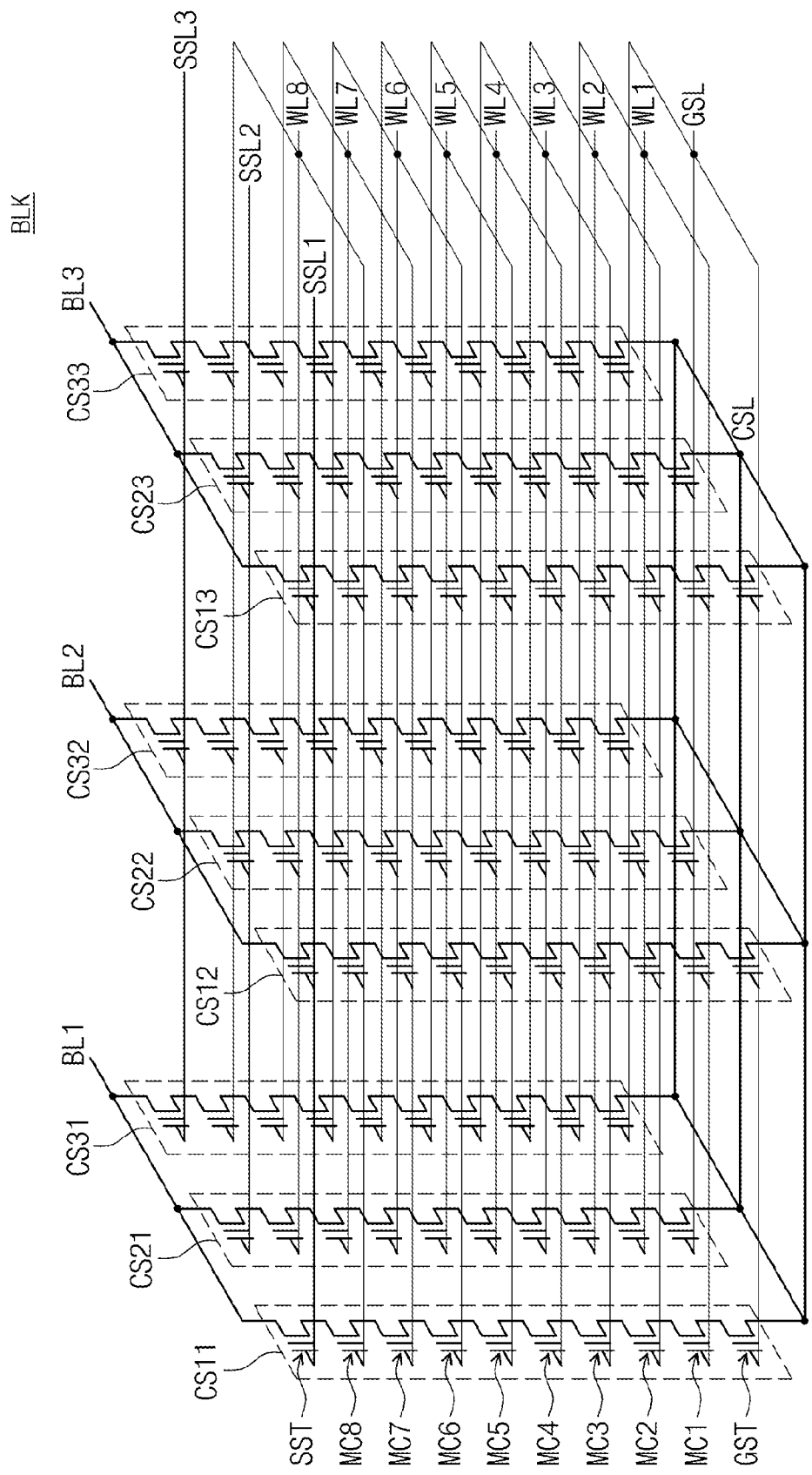
FIG. 4 is a circuit diagram schematically illustrating an equivalent circuit of a memory block BLK shown in FIG. 2, according to an embodiment of the inventive concept.

FIG. 4 is a circuit diagram schematically illustrating an equivalent circuit of a memory block BLK shown in FIG. 2, according to an embodiment of the inventive concept. Referring to FIG. 4, cell strings CS11 to CS33 are connected between bit lines BL1 to BL3 and a common source line CSL. Each cell string (e.g., CS11) includes a string selection transistor SST, a plurality of memory cells MC1 to MC8, and a ground selection transistor GST. In FIG. 4, there is illustrated an example in which a string includes eight memory cells. However, the inventive concept is not limited thereto.

The string selection transistors SST to a string selection line SSL. The string selection lines SSL are divided into first to third string selection lines SSL1 to SSL3. In FIG. 4, there are illustrated three string selection line SSL1 to SSL3 corresponding to a bit line. However, the inventive concept is not limited thereto. The memory block BLK of the inventive concept may be implemented to include at least two string selection lines corresponding to a bit line. The ground selection transistors GST are connected to a ground selection line GSL. Also, the string selection transistors SST are connected to bit lines BL1 to BL3 and the ground selection transistors GST are connected to the common source line CSL.

In each string, the memory cells MC1 to MC8 are connected to corresponding word lines WL1 to WL8. A set of memory cells that are connected to a word line and programmed at the same time may be referred to as a page. The memory block BLK is formed of a plurality of pages. Also, a word line is connected with a plurality of pages. Referring to FIG. 4, a word line (e.g., WL4) with the same height from the common source line CSL is connected in common to three pages.

Meanwhile, each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In a 2-bit MLC, two pages of data may be stored at a physical page. In a 3-bit MLC, six pages of data may be stored at a physical page.

A nonvolatile memory device 100 may be a charge trap flash (CTF) memory device. In this case, there may occur the initial verify shift (IVS) phenomenon that charge trapped in programmed CTF is redistributed and leaked by lapse of time. A reprogramming operation may be performed to overcome such distribution deterioration.

The memory block BLK shown in FIG. 4 has a structure in which a ground selection line GSL is shared. However, the inventive concept is not limited thereto. For example, as a string selection line is divided, so the ground selection line GSL is divided.

Figure 5:
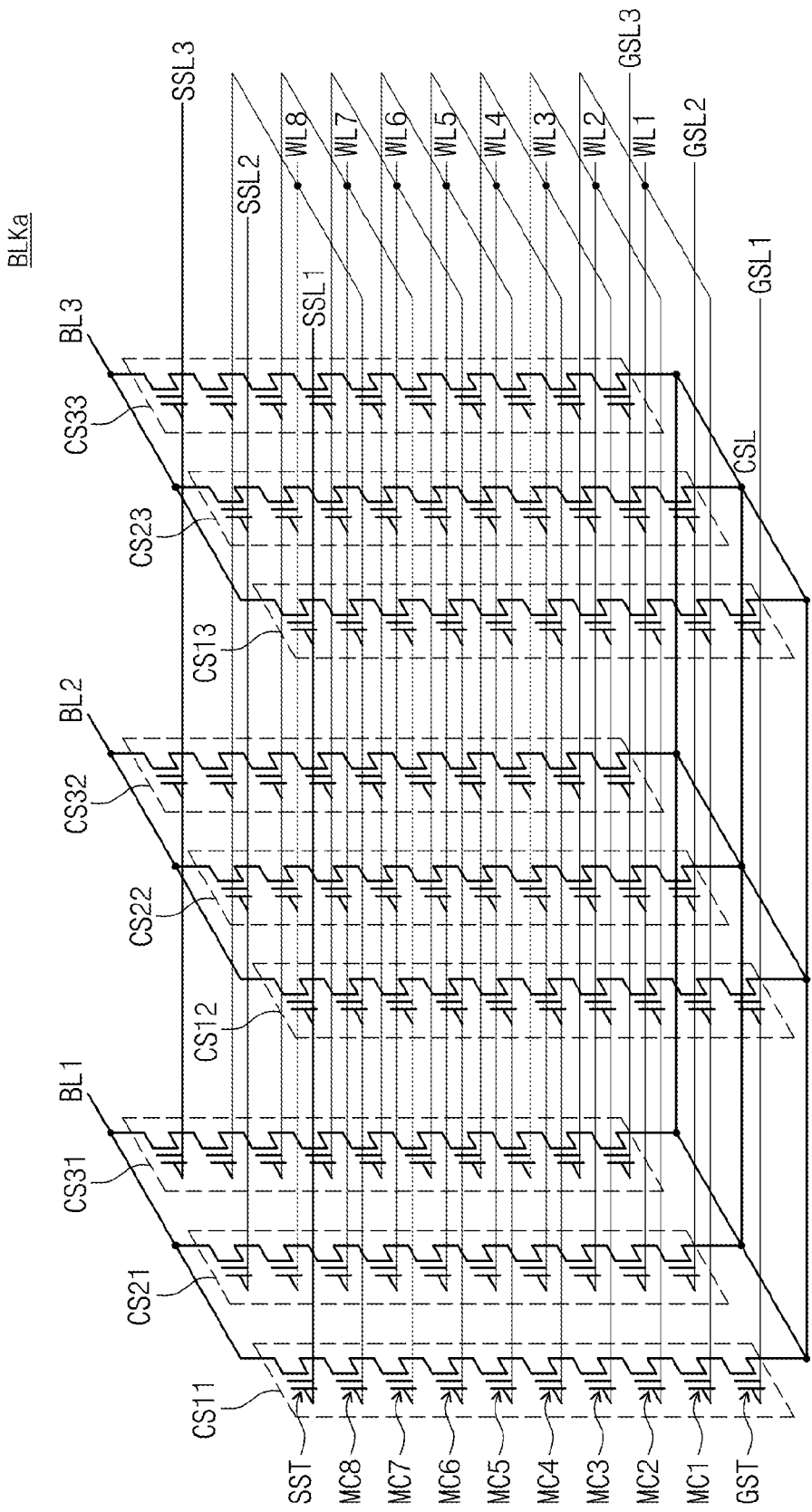
FIG. 5 is a circuit diagram schematically illustrating an equivalent circuit of a memory block BLK shown in FIG. 2, according to another embodiment of the inventive concept.

FIG. 5 is a circuit diagram schematically illustrating an equivalent circuit of a memory block BLK shown in FIG. 2, according to another embodiment of the inventive concept. Referring to FIG. 5, a memory block BLKa is different from a memory block BLK shown in FIG. 4 in that a ground selection line GSL is divided into ground selection lines GSL1 to GSL3. The number of ground selection lines GSL1 to GSL3 is three. However, the inventive concept is not limited thereto. The memory block BLKa of the inventive concept may be configured to include at least two ground selection lines.

In FIGS. 2 to 5, an embodiment of the inventive concept is exemplified as a string is formed between a substrate 111 and a bit line BL. However, the inventive concept is not limited thereto. For example, a string of the inventive concept may be formed to include a first string formed between a bit line BL and the substrate 111 and a second string formed between the substrate 111 and a common source line CSL.

Figure 6:
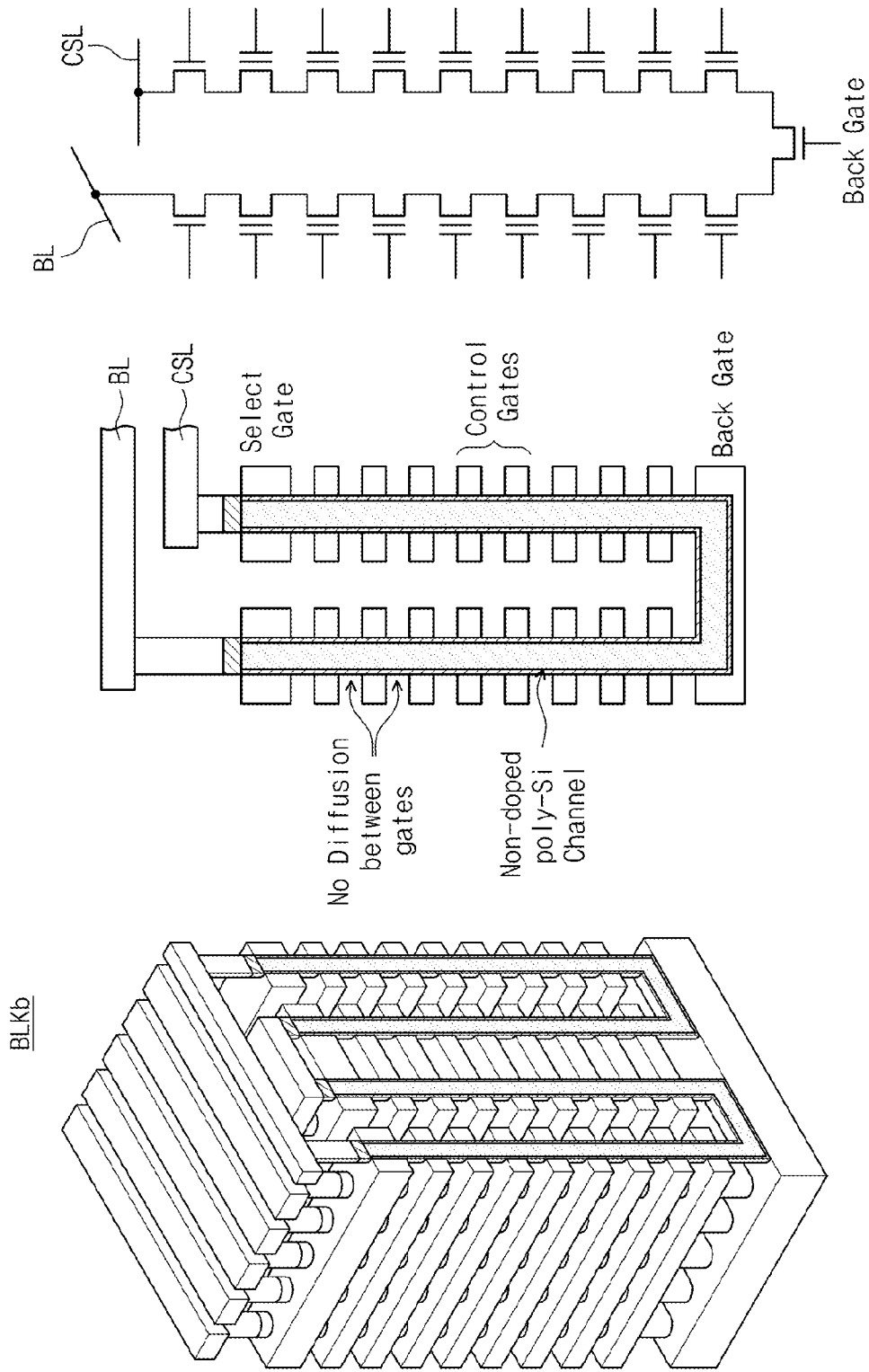
FIG. 6 is a diagram schematically illustrating a memory block according to another embodiment of the inventive concept.

FIG. 6 is a diagram schematically illustrating a memory block according to another embodiment of the inventive concept. Referring to FIG. 6, a string is formed between a bit line BL and a common source line CSL and includes first memory cells formed between the bit line BL and a substrate in a vertical direction and second memory cells formed between the substrate and a common source line CSL in the vertical direction. In exemplary embodiments, a memory block BLKb may be formed to have a P-BiCS (pipe-shaped bit cost scalable) structure.

Figure 7:
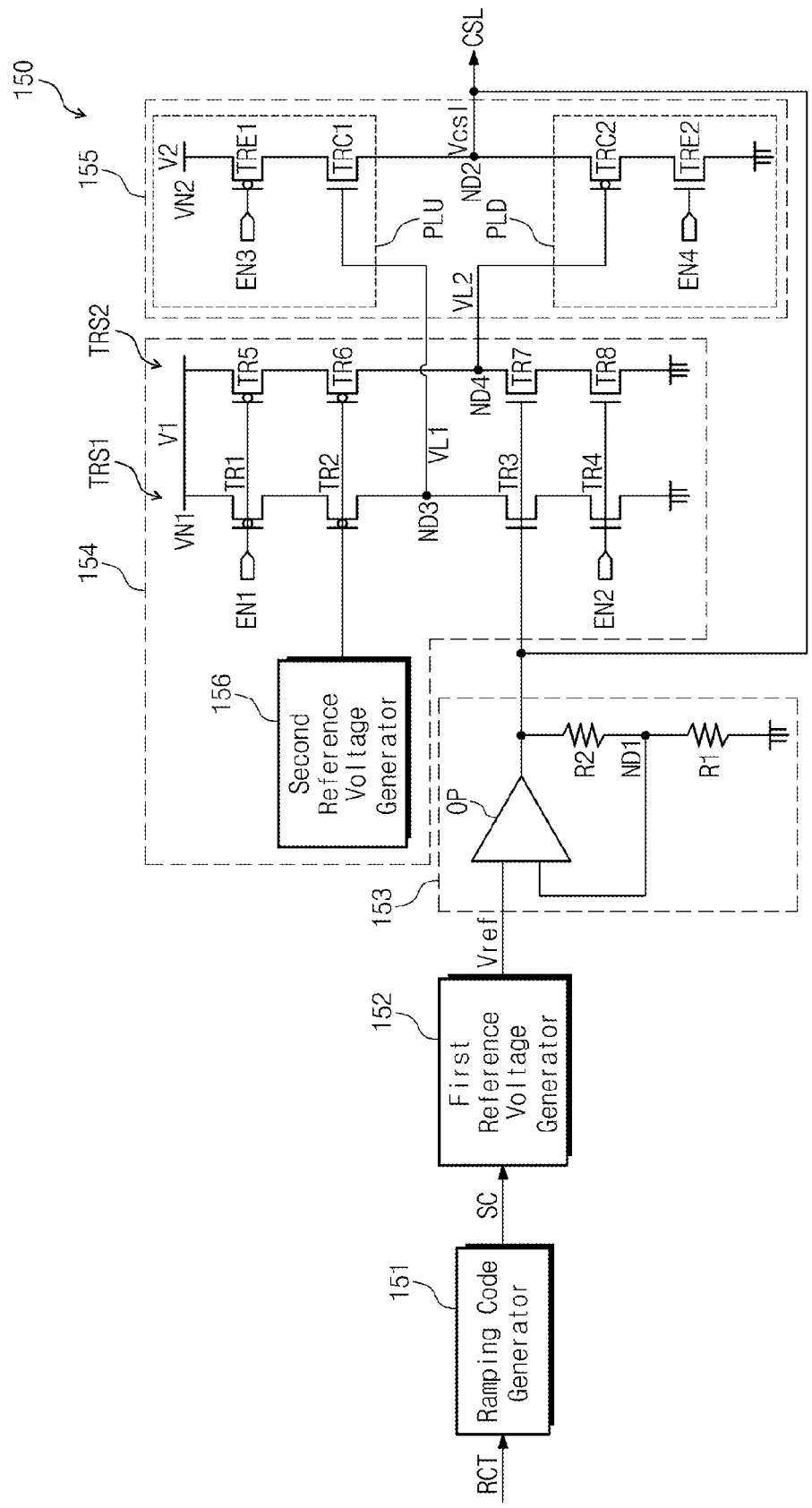
FIG. 7 is a block diagram schematically illustrating a CSL driver according to an embodiment of the inventive concept.

FIG. 7 is a block diagram schematically illustrating a CSL driver 150 according to an embodiment of the inventive concept. Referring to FIG. 7, a CSL driver 150 contains a ramping code generator 151, a first reference voltage generator 152, a differential amplifier 153, an amplifier circuit 154, and a CSL level control unit 155. The ramping code generator 151 receives a ramping control signal RCT and generates a set code signal SC needed to increase or reduce a CSL voltage Vcsl stepwise. The ramping code generator 151 may be implemented with a counter circuit.

The first reference voltage generator 152 outputs a reference voltage Vref corresponding to the set code signal SC. For example, the set code signal SC having a stepwise decreasing value, the first reference voltage generator 152 stepwise reduces a level of the reference voltage Vref. The set code signal SC having a stepwise increasing value, the first reference voltage generator 152 stepwise increases a level of the reference voltage Vref.

The differential amplifier 153 includes an operational amplifier OP, a first resistor R1, and a second resistor R2. The first and second resistors R1 and R2 are connected in series between an output terminal of the operational amplifier OP and a ground. A first input terminal of the operational amplifier OP is connected to receive the reference voltage Vref and its second input terminal is connected to a first node ND1 between the first and second resistors R1 and R2. The output terminal of the operational amplifier OP is electrically connected to a common source line CSL such that the CSL voltage Vcsl is fed back to the output terminal of the operational amplifier OP. The following equation (1) may be established according to a voltage gain of the differential amplifier 153.

$$Vcsl=(1+R1/R2)\times Vref \qquad (1)$$

Now that the common source line CSL is electrically connected to the output terminal of the operational amplifier OP, the differential amplifier 153 amplifies the reference voltage Vref, thereby making it possible to adjust the CSL voltage Vcsl. The amplifier circuit 154 is electrically connected between the differential amplifier 153 and the CSL level control unit 155. The amplifier circuit 154 contains a first transistor string TRS1 and a second transistor string TRS2. One ends of the first and second transistor strings TRS1 and TRS2 are connected to a first voltage node VN1 for receiving a first voltage V1, and the other ends thereof are grounded.

The first transistor string TRS1 includes first to fourth transistors TR1 to TR4 which are connected in series. A source of the first transistor TR1 is connected to the first voltage node VN1, and its drain is connected to a source of the second transistor TR2. A drain of the second transistor TR2 is connected to a drain of the third transistor TR3, and a source of the third transistor TR3 is connected to a drain of the fourth transistor TR4. A source of the fourth transistor TR4 is grounded.

The second transistor string TRS2 includes fifth to eighth transistors TR5 to TR8 which are connected in series. A source of the fifth transistor TR5 is connected to the first voltage node VN1, and its drain is connected to a source of the sixth transistor TR6. A drain of the sixth transistor TR6 is connected to a drain of the seventh transistor TR7, and a source of the seventh transistor TR7 is connected to a drain of the eighth transistor TR8. A source of the eighth transistor TR8 is grounded.

Gates of the first and fifth transistors TR1 and TR5 are connected to receive a first CSL control signal EN1. Gates of the second and sixth transistors TR2 and TR6 are connected to a second reference voltage generator 156 that outputs a constant voltage. Gates of the third and seventh transistors TR3 and TR7 are connected to the output terminal of the operational amplifier OP to receive the CSL voltage Vcsl. Gates of the fourth and eighth transistors TR4 and TR8 are connected to receive a second CSL control signal EN2.

The third and seventh transistors TR3 and TR7 have different resistance values. For example, the size of the seventh transistor TR7 is be larger than that of the third transistors TR3, so a resistance value of the seventh transistor TR7 is greater than that of the third transistor TR3. At this time, the first and fifth transistors TR1 and TR5 have the same resistance value, the second and sixth fifth transistors TR2 and TR6 have the same resistance value, and the fourth and eighth transistors TR4 and TR8 have the same resistance value.

A third node ND3 between the second and third transistors TR2 and TR3 and a fourth node ND4 between the sixth and seventh transistors TR6 and TR7 have different voltage levels. A resistance value of the fourth transistor TR7 being greater than that of the third transistor TR3, a voltage level of the fourth node ND4, that is, a second voltage level VL2 is greater than a voltage level of the third node ND3, that is, a first voltage level VL1.

In exemplary embodiments, the first, second, fifth, and sixth transistors TR1, TR2, TR5, and TR6 are PMOS transistors, and the third, fourth, seventh, and eighth transistors TR3, TR4, TR7, and TR8 are NMOS transistors.

In exemplary embodiments, the first CSL control signal EN1 and the second CSL control signal EN2 are complementary.

The amplifier circuit 154 controls operations of pull-up and pull-down units PLU and PLD. For example, the amplifier circuit 154 turns off the pull-up and pull-down units PLU and PLD or one of the pull-up and pull-down units PLU and PLD. That is, the amplifier circuit 154 controls the pull-up unit PLU and the pull-down unit PLD such that they are not turned on at the same time. The amplifier circuit 154 prevents current paths of the pull-up and pull-down units PLU and PLD of the CSL level control unit 155 from being formed. That is, the amplifier circuit 154 prevents both a current path between a second voltage node V2 in the pull-up down PLU and the second node ND2 and a current path between the second node ND2 in the pull-down unit PLD and a ground from being formed. If current paths are formed between the second voltage node V2 and the second node ND2 and between the second node ND2 and a ground, current loss may be very great.

The CSL level control unit 155 is connected between the amplifier circuit 154 and the common source line CSL. The CSL level control unit 155 contains the pull-up unit PLU and the pull-down unit PLD.

The pull-up unit PLU includes a first enable transistor TRE1 and a first control transistor TRC1 that are connected in series. A source of the first enable transistor TRE1 is connected to the second voltage node VN2 to which the second voltage V2 is applied. A drain of the first enable transistor TRE1 is connected to a drain of the first control transistor TRC1, and a source of the first control transistor TRC1 is connected to the second voltage node ND2 for outputting the CSL voltage Vcsl.

The pull-down unit PLD contains a second enable transistor TRE2 and a second control transistor TRC2 that are connected in series. The second enable transistor TRE2 has a drain connected to the second node ND2, a source connected to a drain of the second control transistor TRC2, and a source grounded.

A gate of the first enable transistor is connected to receive a third CSL control signal EN3, and a gate of the second enable transistor TRE2 is connected to receive a fourth CSL control signal EN4. The first enable transistor TRE1 may be a transistor that activates an operation of the pull-down unit PLU, and the second enable transistor TRE2 may be a transistor that activates an operation of the pull-down unit PLD.

A gate of the first control transistor TRC1 is connected to a third node ND3 of the amplifier circuit 154, and a gate of the second control transistor TRC2 is connected to a fourth node ND4 of the amplifier circuit 154. The first control transistor TRC1 is turned on or off according to a first voltage level VL1 and the second control transistor TRC2 is turned on or off according to a second voltage level VL2.

In exemplary embodiments, the first enable transistor TRE1 and the second control transistor TRC2 are PMOS transistors and the second enable transistor TRE2 and the first control transistor TRC1 are NMOS transistors.

In exemplary embodiments, the third and fourth CSL control signals EN3 and EN4 are complementary.

In operation, when no coupling between a common source line CSL and lines (e.g., a bit line and a string selection line) adjacent thereto occurs, that is, when the CSL voltage Vcsl is constantly maintained, the ramping code generator 151 does not operate and the first reference voltage generator 152 outputs a reference voltage Vref for keeping the CSL voltage Vcsl. The first control transistor TRC1 is turned off by the first voltage level VL1 and the second control transistor TRC2 is turned off by the second voltage level VL2. At this time, the CSL voltage Vcsl is maintained because the common source line CSL is floated.

When the CSL voltage Vcsl increases due to the coupling between the common source line CSL and adjacent lines, the first and second voltage levels VL1 and VL2 decrease as resistance values of the third and seventh transistors TR3 and TR7 become small. The first control transistor TRC1 is turned off by the first voltage level VL1 thus decreased, and the second control transistor TRC2 is turned on by the second voltage level VL2 thus decreased. Charge of the common source line CSL is drained through the transistors TRC2 and TRE2 as much as an increment of the CSL voltage Vcsl. At this time, in case the common source line CSL is stepwise decreased, the ramping code generator 151 generates a set code signal SC with stepwise decreasing data and the first reference voltage generator 152 stepwise decreases a level of the reference voltage Vref.

When the CSL voltage Vcsl decreases due to the coupling between the common source line CSL and adjacent lines, the first and second voltage levels VL1 and VL2 increase as resistance values of the third and seventh transistors TR3 and TR7 become great. The first control transistor TRC1 is turned on by the first voltage level VL1 thus increased, and the second control transistor TRC2 is turned off by the second voltage level VL2 thus increased. The common source line CSL is charged through the transistors TRE1 and TRC1 as much as a decrement of the CSL voltage Vcsl. At this time, in case the common source line CSL is stepwise charged, the ramping code generator 151 generates the set code signal SC with stepwise increasing data and the first reference voltage generator 152 stepwise increases a level of the reference voltage Vref.

The CSL driver 150 of the inventive concept may pull down or up the common source line CSL using the CSL voltage Vcsl as a feedback signal.

Figure 8:
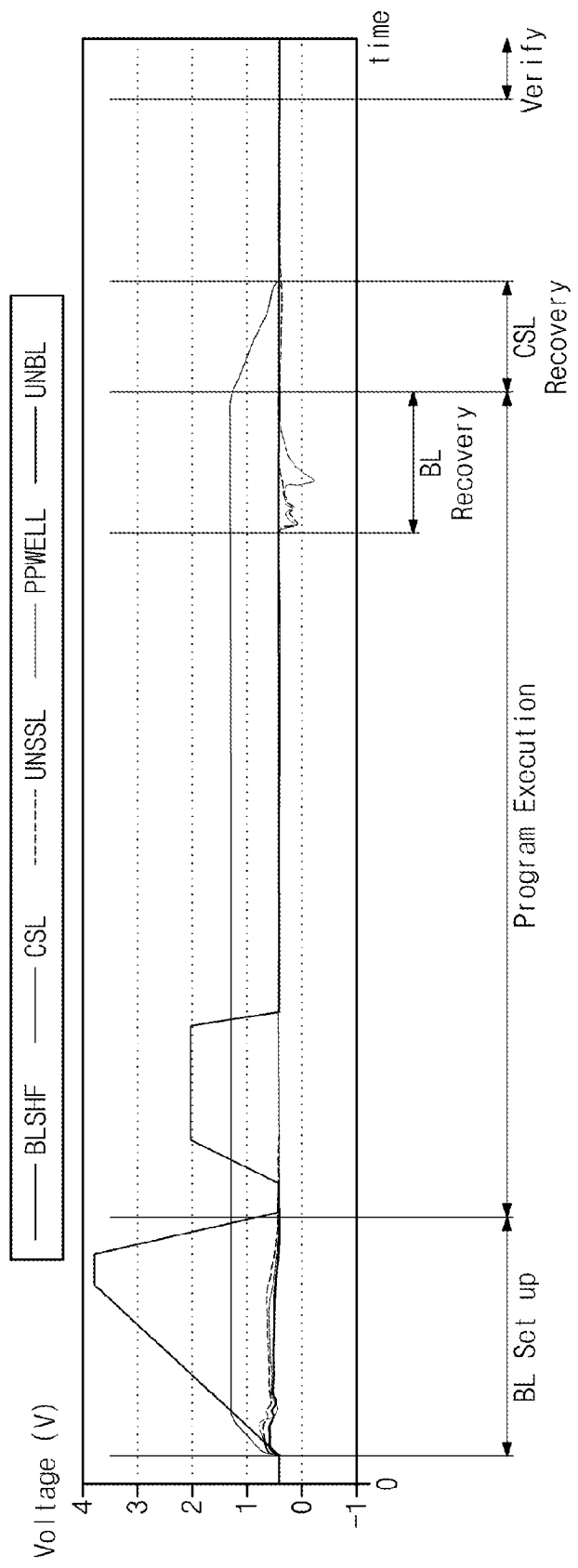
FIG. 8 is a diagram showing waveforms of signals measured during a program loop in a nonvolatile memory device 100 according to an embodiment of the inventive concept.

FIG. 8 is a diagram showing waveforms of signals measured during a program loop in a nonvolatile memory device 100 according to an embodiment of the inventive concept. Referring to FIG. 8, during a bit line setup period in which a bit line shut-off voltage BLSHF is applied, a power supply voltage VDD is applied to a bit line that is connected to a memory cell to be program inhibited. A CSL voltage Vcsl may increase due to the coupling between a common source line CSL and the bit line to which the bit line shut-off voltage BLSHF is applied. If charge at the common source line CSL is not discharged, the CSL voltage Vcsl may increase. In this case, even though a voltage UNSSL of an unselected string selection line, a voltage PPWELL of a pocket p well, and a voltage UNBL of an unselected bit line are grounded, they increase due to the coupling with the common source line CSL.

A CSL driver 150 of the inventive concept may constantly maintain the CSL voltage Vcsl through a pull-down operation of a pull-down unit PLD shown in FIG. 7. Now that the CSL voltage Vcsl of the inventive concept is constantly maintained during the bit line setup period, a voltage UNSSL of an unselected string selection line, a voltage PPWELL of a pocket p well, and a voltage UNBL of an unselected bit line may be maintained with a ground. Thus, it is possible to prevent a threshold voltage distribution of memory cells of an unselected block from being disturbed.

The CSL voltage Vcsl may be constantly maintained during a program execution period. In particular, the CSL voltage Vcsl may decrease when a power supply voltage applied to a bit line is discharged during a bit line recovery period. If the common source line CSL is charged, the CSL voltage Vcsl may decrease. In this case, a voltage UNSSL of an unselected string selection line, a voltage PPWELL of a pocket p well, and a voltage UNBL of an unselected bit line may decrease due to the coupling with the common source line CSL.

The CSL driver 150 of the inventive concept may constantly maintain the CSL voltage Vcsl through a pull-up operation of a pull-up unit PLU shown in FIG. 7. Now that the CSL voltage Vcsl of the inventive concept is constantly maintained during the bit line recovery period, it is possible to mitigate the problem that a voltage UNSSL of an unselected string selection line, a voltage PPWELL of a pocket p well, and a voltage UNBL of an unselected bit line decrease due to the coupling. Thus, a threshold voltage distribution of memory cells of an unselected block is prevented from being disturbed.

The CSL voltage Vcsl transitions to a ground during a CSL recovery period. the CSL voltage Vcsl sharply transitioning to a ground, a voltage UNSSL of an unselected string selection line, a voltage PPWELL of a pocket p well, and a voltage UNBL of an unselected bit line may decrease due to the coupling with the common source line CSL. The CSL driver 150 of the inventive concept stepwise reduces the CSL voltage Vcsl through a ramping operation during the CSL recovery period, making it possible to mitigate the problem that a voltage UNSSL of an unselected string selection line, a voltage PPWELL of a pocket p well, and a voltage UNBL of an unselected bit line decrease due to the coupling. Thus, a threshold voltage distribution of memory cells connected to an unselected bit line is improved.

In general, a verification period may begin after about 10 μs from a bit line recovery period. Even though the CSL voltage Vcsl stepwise decreases, the CSL recovery period should be completed after the bit line recovery period and before the verification period. The CSL recovery period may be completed within about 4 μs from the bit line recovery period.

Figure 9:
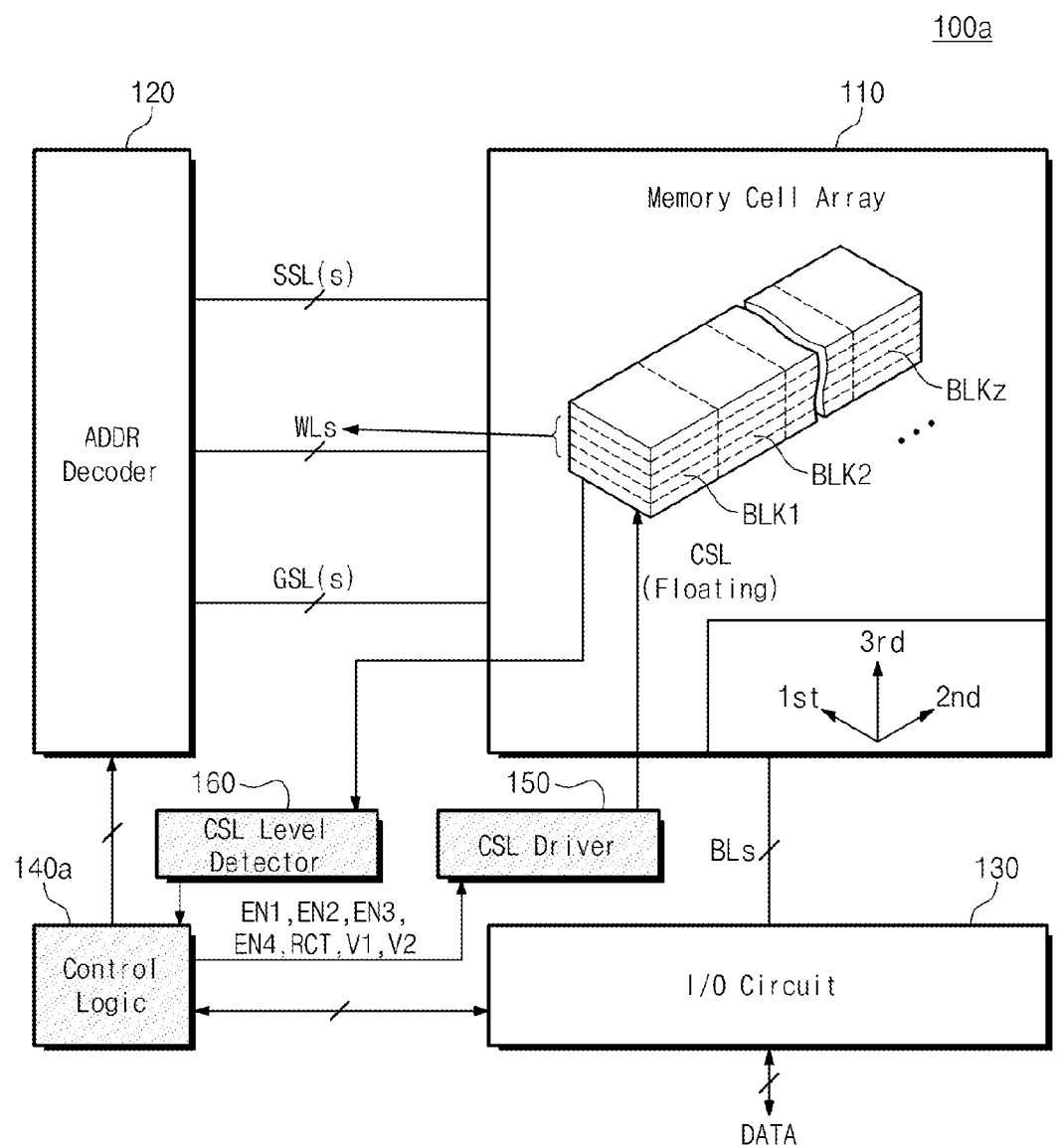
FIG. 9 is a block diagram schematically illustrating a nonvolatile memory device according to another embodiment of the inventive concept.

FIG. 9 is a block diagram schematically illustrating a nonvolatile memory device according to another embodiment of the inventive concept. Referring to FIG. 9, a nonvolatile memory device 100a includes a memory cell array 110, an address decoder 120, an input/output circuit 130, control logic 140a, a CSL driver 150, and a CSL level detector 160. As compared to a nonvolatile memory device 100 shown in FIG. 1, the nonvolatile memory device 100a further comprises the CSL level detector 160.

The CSL level detector 160 detects a voltage level of a common source line CSL. The control logic 140a generates CSL control signals EN1 to EN4 and a ramping control signal RCT according to the detected voltage level of the CSL. For example, when a voltage level of the common source line CSL is different from a predetermined voltage level at a program operation, the control logic 140a generates the CSL control signals EN1 to EN4 and the ramping control signal RCT to supply or drain charge to or from the common source line CSL. The control logic 140a also generates a first voltage V1 and a second voltage V2.

Meanwhile, a nonvolatile memory device according to an embodiment of the inventive concept may be configured to control to float a common source line CSL based on a temperature of a memory cell array.

Figure 10:
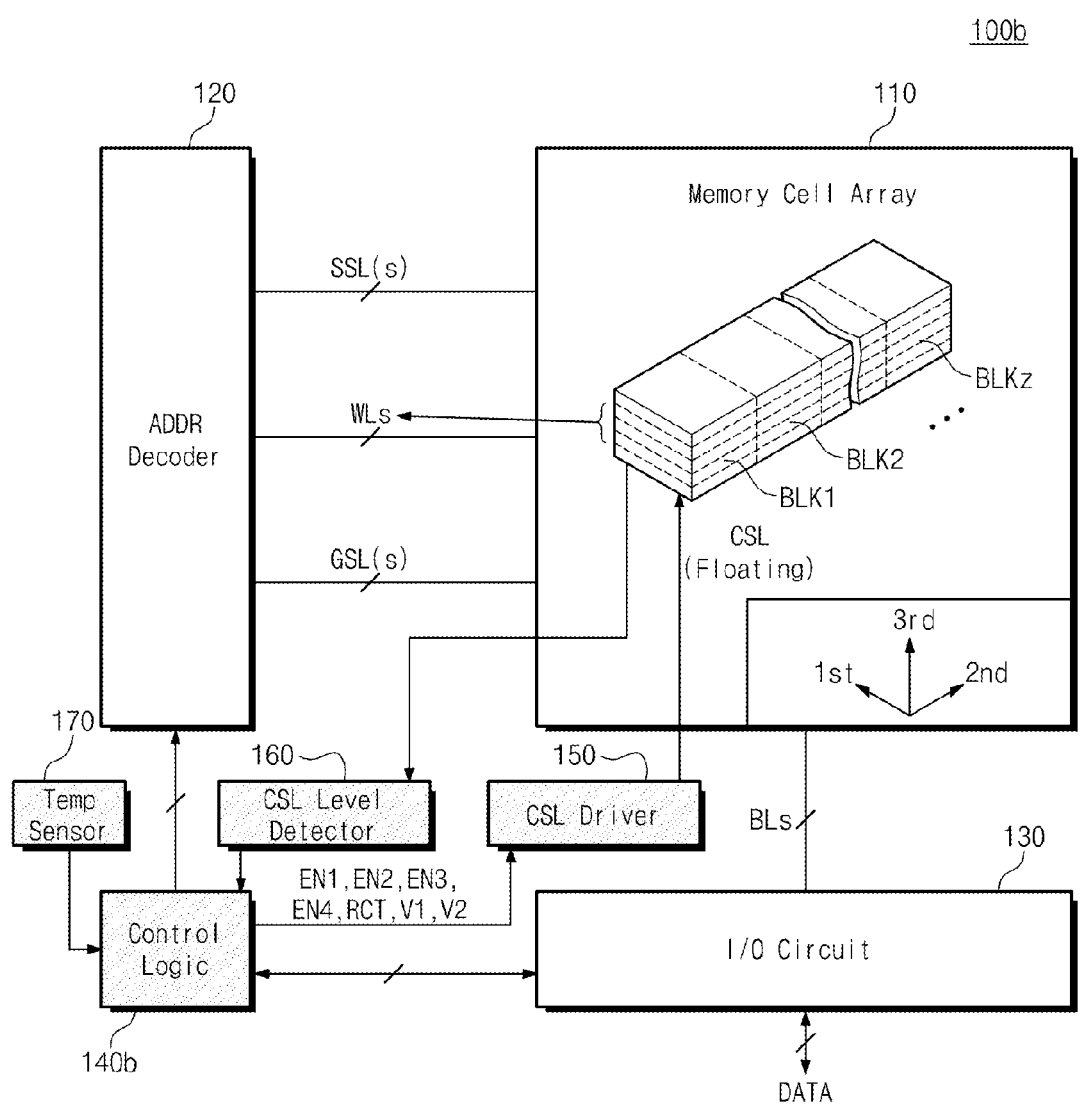
FIG. 10 is a block diagram schematically illustrating a nonvolatile memory device according to still another embodiment of the inventive concept.

FIG. 10 is a block diagram schematically illustrating a nonvolatile memory device according to still another embodiment of the inventive concept. Referring to FIG. 10, a nonvolatile memory device 100b includes a memory cell array 110, an address decoder 120, an input/output circuit 130, control logic 140b, a CSL driver 150, a CSL level detector 160, and a temperature sensor 170. As compared to a nonvolatile memory device 100a shown in FIG. 9, the nonvolatile memory device 100b further comprises the temperature sensor 170.

The temperature sensor 170 senses a temperature of the memory cell array 110 and outputs a value corresponding to the sensed temperature. The control logic 140b generates CSL control signals EN1 to EN4 and a ramping control signal RCT based on a value corresponding to a voltage level of a common source line CSL from the CSL level detector 160 and a temperature value from the temperature sensor 170. For example, when at a program operation, a voltage level of the common source line CSL is different from a predetermined value and a temperature of the memory cell array 110 is over a predetermined value, the control logic 140b generates the control signals EN1 to EN4 and RCT to drain or supply charge from or to the common source line CSL. The control logic 140b also generates a first voltage V1 and a second voltage V2.

Figure 11:
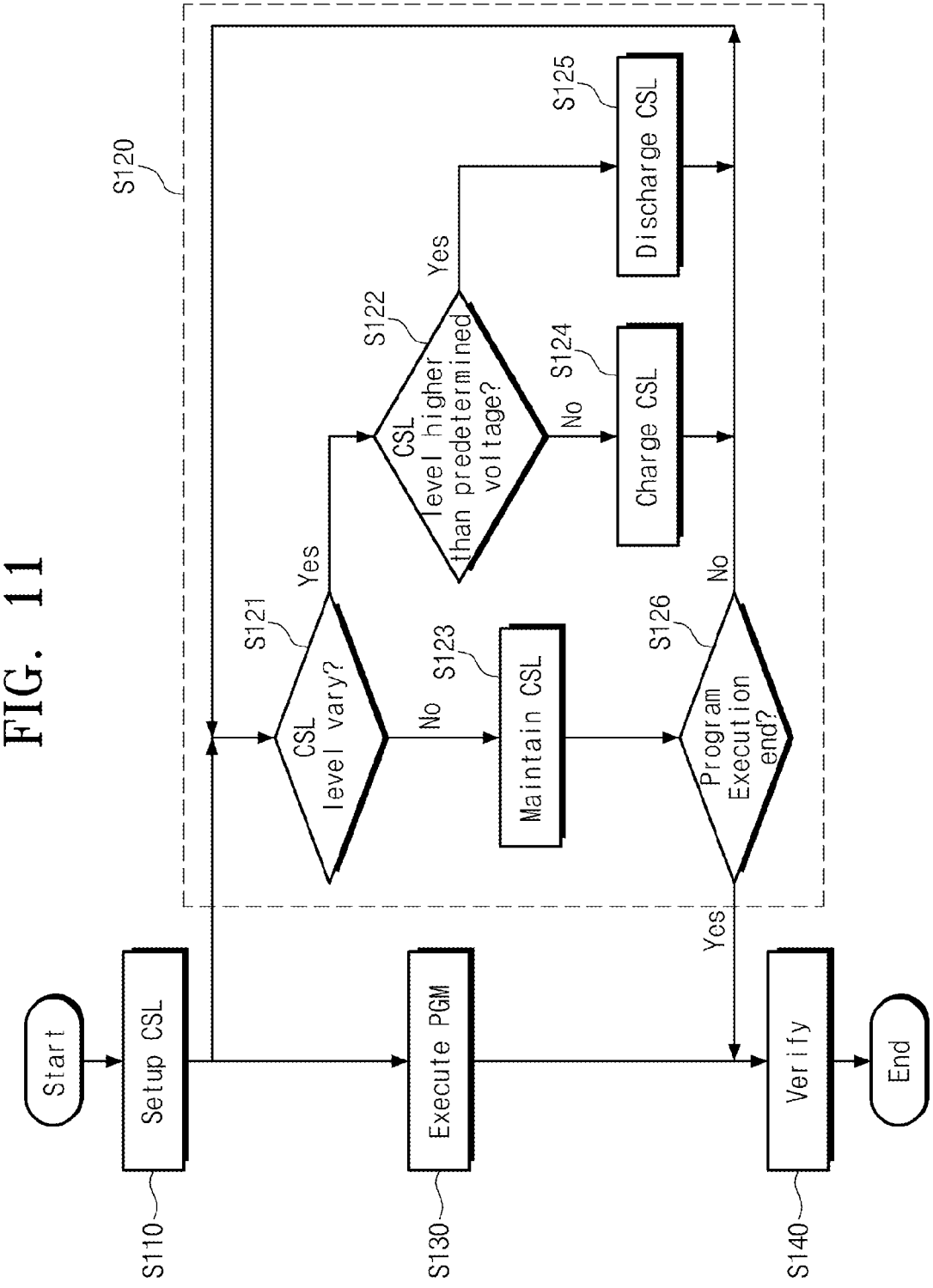
FIG. 11 is a flow chart schematically illustrating a program method of a nonvolatile memory device according to an embodiment of the inventive concept.

FIG. 11 is a flow chart schematically illustrating a program method of a nonvolatile memory device according to an embodiment of the inventive concept. Below, a program method of a nonvolatile memory device will be more fully described with reference to FIGS. 1 to 11. In step S110, a common source line CSL is set up with a predetermined voltage. In step S130, a program operation is executed by applying a program pulse to a selected word line. Meanwhile, in step S120, charge is supplied to or drained from the common source line CSL using a voltage level of the common source line CSL as a feedback signal. In step S120, charge is supplied to or drained from the common source line CSL as much as a voltage variation of the common source line CSL. An operation corresponding to step S120 may be performed while the program operation is executed. In step S140, a verification operation is performed to determine whether or not a program operation is normally performed.

Below, step S120 will be described in detail. First, in step S121, whether or not a voltage level of the common source line CSL varies on the basis of a predetermined voltage is determined. As a consequence of determining that a voltage level of the common source line CSL varies, in step S122, there is determined whether or not a voltage level of the common source line CSL is higher than a predetermined voltage level. A voltage level of the common source line CSL being higher than the predetermined voltage level, in step S125, charge at the common source line CSL is drained. In this case, a voltage level of the common source line CSL may be the predetermined voltage. A voltage level of the common source line CSL being lower than the predetermined voltage level, in step S124, the common source line CSL is charged. In this case, a voltage level of the common source line CSL may be the predetermined voltage. Returning to step S121, if a voltage level of the common source line CSL does not vary, it may be maintained.

In step S126, whether or not the program operation is ended is determined after steps S123, S124, and S125. As a consequence of determining that the program operation is ended, the method proceeds to step S140. As a consequence of determining that the program operation is not ended, the method proceeds to step S121.

Figure 12:
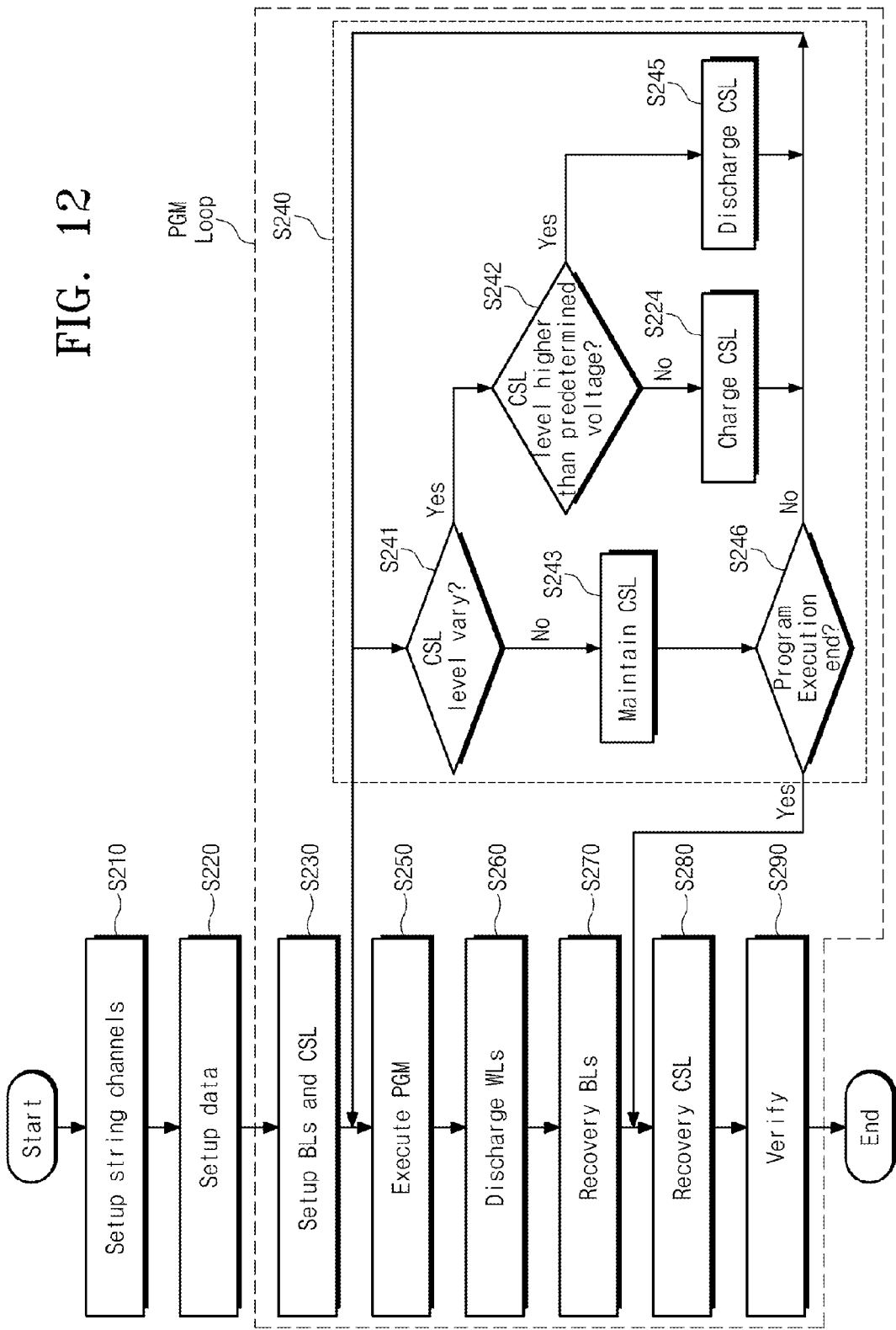
FIG. 12 is a flow chart schematically illustrating a program method of a nonvolatile memory device according to another embodiment of the inventive concept.

FIG. 12 is a flow chart schematically illustrating a program method of a nonvolatile memory device according to another embodiment of the inventive concept. Below, a program method of a nonvolatile memory device will be more fully described with reference to FIGS. 1 to 10 and 12.

In step S210, channels of selected and unselected strings are set up. Charge included in channels may be discharged to a ground during an operation of setting up the channels. Data to be programmed may be set up in an input/output circuit 130 (refer to FIG. 1). In step S220, a plurality of page buffers in the input/output circuit 130 receive data to be programmed. In some cases, a dumping operation about the input data may be performed. Afterwards, a program loop may commence. The program loop may contain steps S230 to S280. If a result of a verification operation indicates that a program operation is not completed, the program loop may be repeated by applying a program pulse Vpgm with a predetermined value. Below, each step of the program loop will be more fully described.

Bit lines and a common source line CSL are set up. For example, a voltage of 0 V is applied to bit lines connected to memory cells to be programmed and a power supply voltage VDD is applied to bit lines connected to memory cells to be program inhibited. The common source line CSL is set up with a predetermined voltage (S230).

Afterwards, in step S240, charge is supplied to or drained from the common source line CSL using a voltage level of the common source line CSL as a feedback signal. For example, charge is supplied to or drained from the common source line CSL using a voltage level of the common source line CSL as a feedback signal, as much as a voltage variation of the common source line CSL.

Below, step S240 will be described in detail. First, in step S241, whether or not a voltage level of the common source line CSL varies on the basis of a predetermined voltage is determined. As a consequence of determining that a voltage level of the common source line CSL varies, in step S242, there is determined whether or not a voltage level of the common source line CSL is higher than a predetermined voltage level.

A voltage level of the common source line CSL being higher than the predetermined voltage level, in step S245, charge at the common source line CSL is discharged. In this case, a voltage level of the common source line CSL may be the predetermined voltage. A voltage level of the common source line CSL being lower than the predetermined voltage level, in step S244, the common source line CSL is charged. In this case, a voltage level of the common source line CSL may be the predetermined voltage. Returning to step S241, if a voltage level of the common source line CSL does not vary, it may be maintained.

In step S246, whether or not the program operation is ended is determined after steps S243, S244, and S245. As a consequence of determining that the program operation is ended, the method proceeds to step S280. As a consequence of determining that the program operation is not ended, the method proceeds to step S241.

After step S230, in step S250, a program operation is executed separately from step S240. During the program operation, a program pulse, that is, a program voltage is applied to a selected word line and a program-pass voltage is applied to unselected word lines.

In step S250, charge at word lines is discharged to perform a verification operation. In step S270, a recovery operation about bit lines is performed. In step S280, performed is a recovery operation about the common source line CSL. The recovery operation about the CSL may make a voltage level of the CSL decrease stepwise. In other words, the recovery operation about the CSL is an operation of discharging charge at the common source line CSL in a step type or a lamp type. The recovery operation about the CSL may be completed within about 4 μs after the recovery operation about the bit lines.

In step S290, performed is a verification operation using a verification pulse to determine whether memory cells connected to a selected word line is normally programmed.

Meanwhile, in FIG. 12, an embodiment of the inventive concept is exemplified as charge at the common source line CSL is discharged after voltages at word lines are discharged. However, the inventive concept is not limited thereto. Voltages at the word lines may be discharged after a discharge operation about the common source line CSL.

Figure 13:
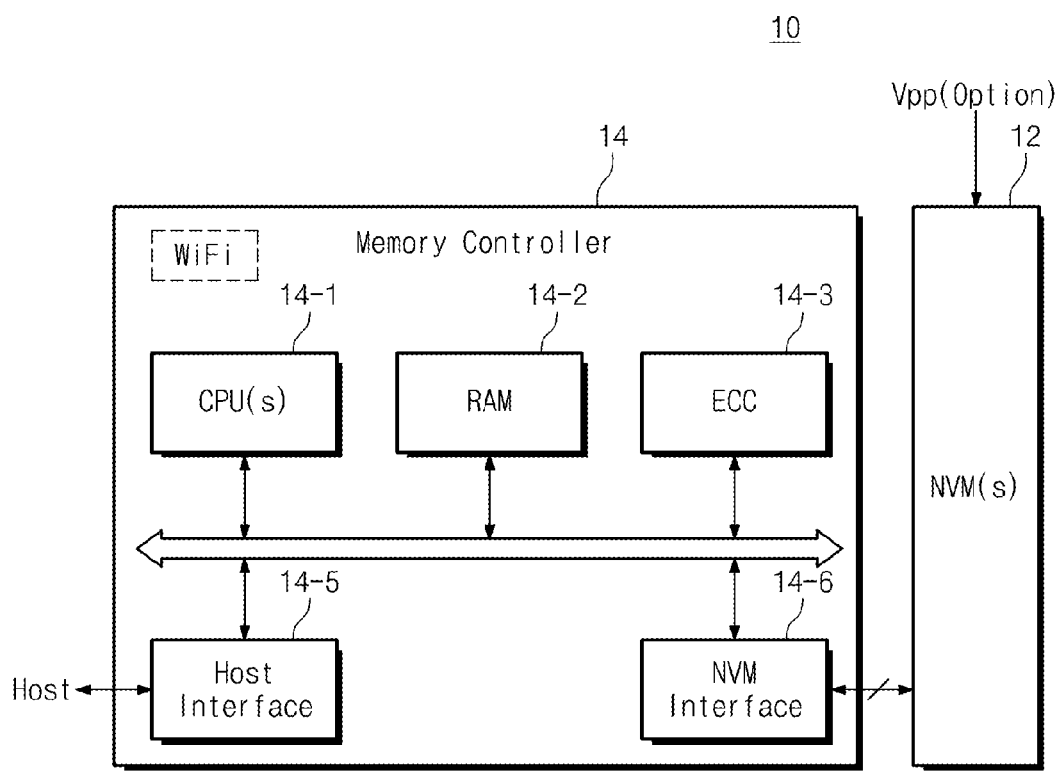
FIG. 13 is a block diagram schematically illustrating a storage device according to an embodiment of the inventive concept.

FIG. 13 is a block diagram schematically illustrating a storage device 10 according to an embodiment of the inventive concept. Referring to FIG. 13, a storage device 10 contains at least one nonvolatile memory device 12 and a memory controller 14 controlling the nonvolatile memory device 12. The storage device 10 shown in FIG. 13 may be used as, but not limited to, a storage medium of a memory card (e.g., CF, SD, micro SD, and so on) or an USB storage device. The nonvolatile memory device 12 may be implemented with one of nonvolatile memory devices shown in FIGS. 1 to 10.

The memory controller 14 controls read, write, and erase operations of the nonvolatile memory device 12 in response to a host request. The memory controller 14 contains at least one central processing unit 14-1, a buffer memory 14-2, an ECC block 14-3, a host interface 14-5, and an NVM interface 14-6.

The central processing unit 14-1 controls an overall operation of the nonvolatile memory device 12 including writing, reading, management of a file system, management of bad pages, and so on. The RAM 14-2 operates in response to a control of the central processing unit 14-1 and is used as a work memory, a buffer memory, and a cache memory. If the RAM 14-2 is used as a work memory, data processed by the central processing unit 14-1 is temporarily stored therein. If used as a buffer memory, the RAM 14-2 is used to buffer data that is transferred from a host to the nonvolatile memory device 12 or from the nonvolatile memory device 12 to the host. As a cache memory, the RAM 14-2 may enable a low-speed nonvolatile memory device 12 to operate at high speed.

The ECC block 14-3 generates an error correction code ECC for correcting a fail bit or an error bit of data received from the nonvolatile memory device 12. The ECC block 14-3 performs error correction encoding on data to be provided to the nonvolatile memory device 12, so a parity bit is added thereto. The parity bit may be stored in the nonvolatile memory device 12. The ECC block 14-3 performs error correction decoding on data output from the nonvolatile memory device 12. The ECC block 14-3 corrects an error using the parity. The ECC block 14-3 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), and so on.

The memory controller 14 exchanges data with the host through the host interface 14-5 and with the nonvolatile memory device 42 through the NVM interface 14-6. The host interface 14-5 may be connected with a host via PATA (Parallel AT Attachment bus), SATA (Serial AT attachment bus), SCSI, USB, PCIe, NAND interface, and so on.

In exemplary embodiments, the memory controller 14 may contain an RF communication function (e.g., WiFi).

The inventive concept is applicable to a solid state drive (SSD).

Figure 14:
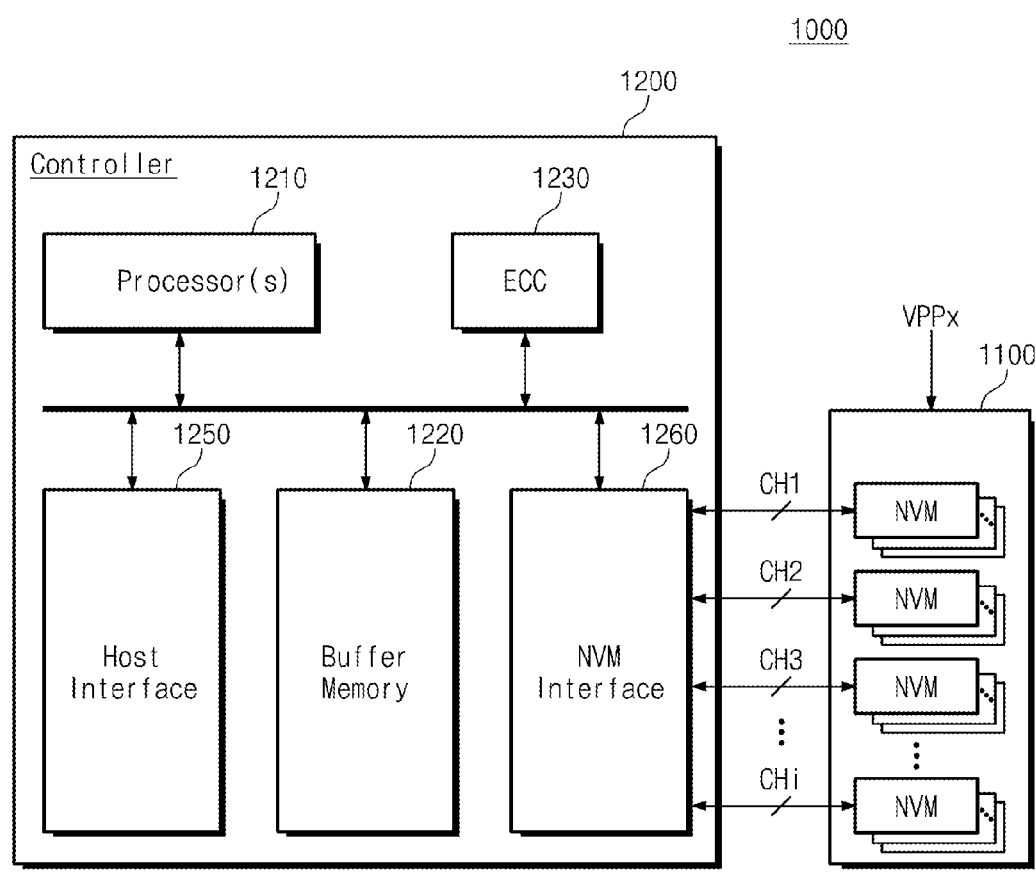
FIG. 14 is a block diagram schematically illustrating a solid state drive according to an embodiment of the inventive concept.

FIG. 14 is a block diagram schematically illustrating a solid state drive according to an embodiment of the inventive concept. Referring to FIG. 14, a solid state drive (hereinafter, referred to as SSD) 1000 includes a plurality of nonvolatile memory devices 1100 and an SSD controller 1200.

The nonvolatile memory devices 1100 may be optionally supplied with an external high voltage VPPx. Each of nonvolatile memory devices 1100 may be configured to perform a program operation after a common source line is floated as described with reference to FIGS. 1 to 10. The SSD controller 1200 is connected to the nonvolatile memory devices 1100 through a plurality of channels CH1 to CHi (i being an integer of 2 or more). The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. In exemplary embodiments, the buffer memory 1220 may include a plurality of memory lines each of which stores data or a command. The memory lines may be mapped onto cache lines via various methods. The ECC block 1230 is configured to calculate an ECC value of data to be programmed at a write operation, correct an error of read data according to an ECC value at a read operation, and correct an error of data restored from the nonvolatile memory device 1100 at a data restoration operation. Although not shown in FIG. 14, a code memory may be further provided to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces. The nonvolatile memory interface 1260 provides an interface with the nonvolatile memory devices 1100.

The SSD 1000 according to an embodiment of the inventive concept supplies or drains charge to or from a common source line using a voltage level of the CSL as a feedback signal to maintain a voltage level of the CSL, thereby making it possible to minimize bit line coupling and to prevent disturbance of a threshold voltage distribution of memory cells of an unselected block.

The inventive concept is applicable to an eMMC (e.g., an embedded multimedia card, moviNAND, iNAND, etc.).

Figure 15:
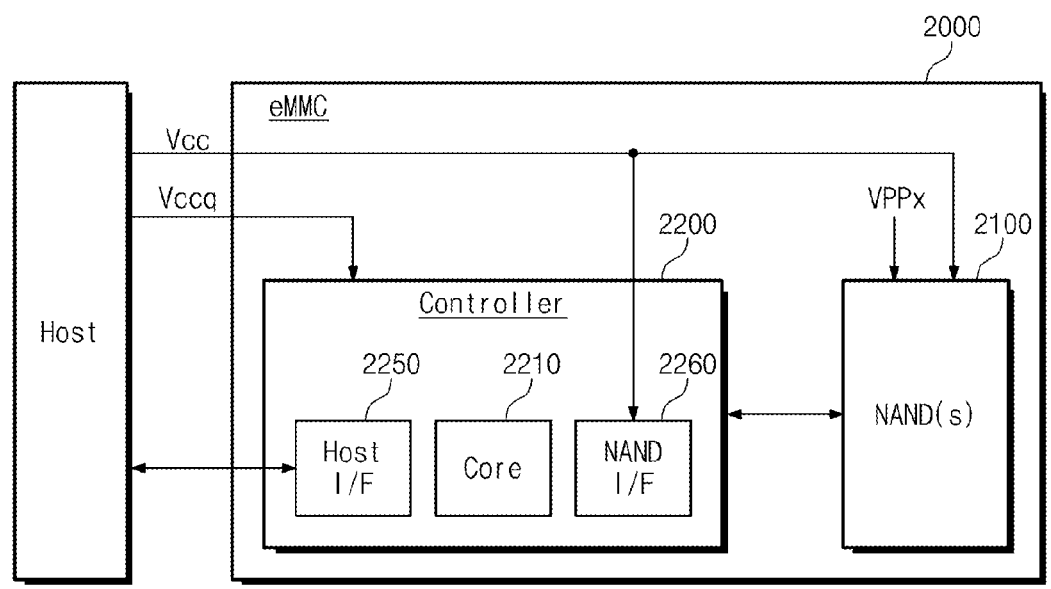
FIG. 15 is a block diagram schematically illustrating an eMMC according to an embodiment of the inventive concept.

FIG. 15 is a block diagram schematically illustrating an eMMC according to an embodiment of the inventive concept. Referring to FIG. 15, an eMMC 2000 includes one or more NAND flash memory devices 2100 and a controller 2200.

The NAND flash memory device 2100 is configured to perform a program operation that makes the coupling between a common source line CSL and a bit line minimized by controlling the CSL as described with reference to FIGS. 1 to 10. The controller 2200 is connected to the NAND flash memory device 2100 via a plurality of channels. The controller 2200 includes one or more controller cores 2210, a host interface 2250, and a NAND interface 2260. The controller core 2210 may control an overall operation of the eMMC 2000. The host interface 2250 is configured to interface between the controller 2200 and a host. The NAND interface 2260 is configured to interface between the NAND flash memory device 2100 and the controller 2200. In exemplary embodiments, the host interface 2250 may be a parallel interface (e.g., MMC interface). In other exemplary embodiments, the host interface 2250 of the eMMC 2000 may be a serial interface (e.g., UHS-II, UFS interface, and so on). Alternatively, the host interface 2250 of the eMMC 2000 may be a NAND interface.

The eMMC 2000 receives power supply voltages Vcc and Vccq from the host. Here, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The inventive concept is applicable to Universal Flash Storage UFS.

Figure 16:
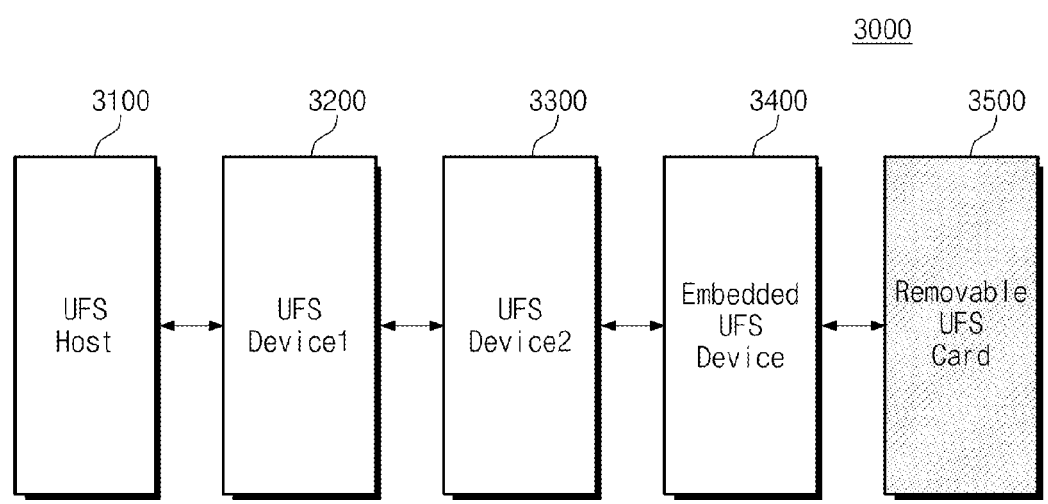
FIG. 16 is a block diagram schematically illustrating a UFS system according to an embodiment of the inventive concept.

FIG. 16 is a block diagram schematically illustrating a UFS system according to an embodiment of the inventive concept. Referring to FIG. 16, a UFS system 3000 includes a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may be implemented with a storage device 10 shown in FIG. 13.

Meanwhile, the embedded UFS device 3400 and the removable UFS card 3500 may communicate with each other using protocols different from the UFS protocol. The UFS host 3100 and the removable UFS card 3500 may communicate through various card protocols (e.g., UFDs, MMC, SD (secure digital), mini SD, Micro SD, and so on).

The inventive concept is applicable to a mobile device.

Figure 17:
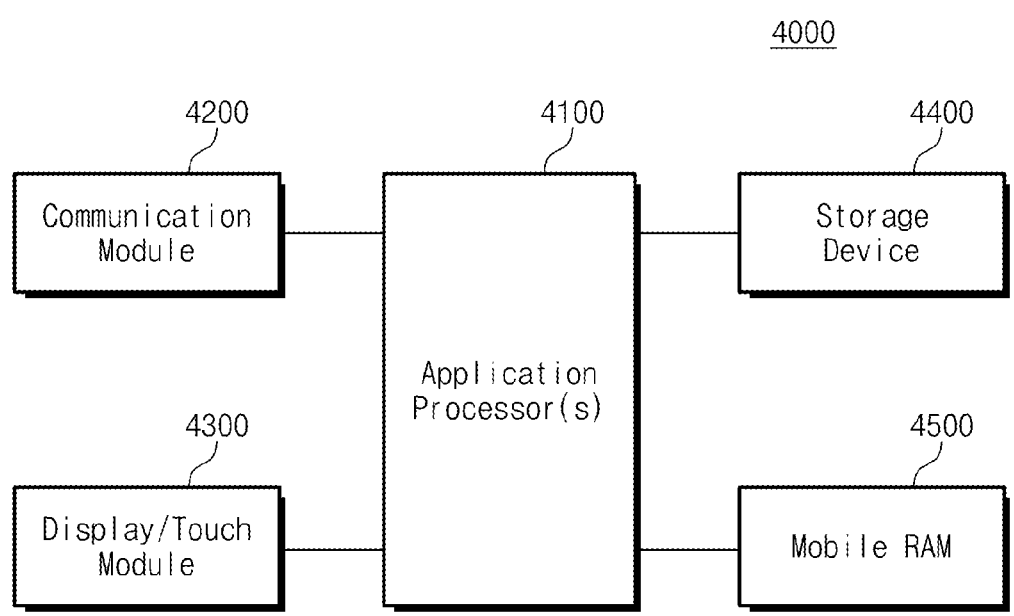
FIG. 17 is a block diagram schematically illustrating a mobile device according to an embodiment of the inventive concept.

FIG. 17 is a block diagram schematically illustrating a mobile device 4000 according to an embodiment of the inventive concept. Referring to FIG. 17, a mobile device 4000 includes an application processor 4100, a communication module 4200, a display/touch module 4300, a storage device 4400, and a mobile RAM 4500.

The application processor 4100 controls an overall operation of the mobile device 4000. The communication module 4200 is configured to perform wireless or wire communications with an external device. The display/touch module 4300 is configured to display data processed by the application processor 4100 or to receive data through a touch panel. The storage device 4400 is configured to store user data. The storage device 4400 may be, but not limited to, a memory card, an eMMC, an SSD, or an UFS device. The storage device 4400 is configured to prevent a threshold voltage distribution of memory cells in an unselected block from being disturbed as described with reference to FIGS. 1 to 10. The mobile RAM 4500 is configured to temporarily store data necessary when the mobile device 4000 operates.

Performance of the mobile device 4000 according to an embodiment of the inventive concept may be improved through the storage device 4400 that prevents a threshold voltage distribution from being disturbed.

A memory system and/or a storage device according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and so on.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
    a memory cell array including a plurality of memory blocks each having a plurality of strings formed in a direction perpendicular to a substrate and connected between bit lines and a common source line;
    an address decoder adapted to select one of the plurality of memory blocks based upon an address;
    an input/output circuit adapted to store data to be programmed at memory cells connected to a selected one of word lines of a selected memory block, of the plurality of memory blocks, for a program operation and store data read from the memory cells connected to the selected word line for a verification operation;
    a common source line driver adapted to set the common source line with a preset voltage, and, selectively drain charge from and supply charge to the common source line using a voltage level of the common source line as a feedback signal; and
    control logic adapted to control the address decoder, the input/output circuit, and the common source line driver for the program operation and the verification operation;
    wherein the common source line driver stepwise decreases a voltage level of the common source line during a common source line recovery period.

2. The nonvolatile memory device of claim 1, wherein the common source line driver selectively supplies charge to and drains charge from the common source line as a difference between the preset voltage and the voltage level of the common source line.

3. The nonvolatile memory device of claim 1, wherein the common source line driver comprises:
    a differential amplifier adapted to amplify a reference voltage to adjust the voltage level of the common source line; and
    a common source line level control unit including a pull-up unit adapted to supply charge to the common source line and a pull-down unit adapted to drain charge from the common source line.

4. The nonvolatile memory device of claim 1, wherein an output terminal of the differential amplifier is electrically coupled to the common source line.

5. The nonvolatile memory device of claim 1, wherein the pull-up unit comprises a first enable transistor and a first control transistor connected in series between a second voltage node, supplied with a second voltage, and the common source line; and wherein the pull-down unit comprises a second enable transistor and a second control transistor connected in series between the common source line and a ground.

6. The nonvolatile memory device of claim 5, wherein the common source line driver further comprises:
an amplification circuit electrically coupled between the differential amplifier and the common source line level control unit and adapted to control operations of the pull-up and pull-down units.

7. The nonvolatile memory device of claim 5, wherein the amplification circuit is adapted to turn off at least one of the pull-up unit and the pull-down unit.

8. The nonvolatile memory device of claim 6, wherein the amplification circuit comprises:
a first transistor string having first to fourth transistors connected in series between a first voltage node, supplied with a first voltage, and a ground; and
a second transistor string having fifth to eighth transistors connected in series between the second voltage node and the ground; and
wherein the first and second transistors have a same resistance value, the second and sixth transistors have a same resistance value, the fourth and eighth transistors have a same resistance value, and the third and seventh transistors have different resistance values.

9. The nonvolatile memory device of claim 8, wherein a gate of the first control transistor is connected to a node between the second and third transistors; and wherein a gate of the second control transistor is connected to a node between the sixth and seventh transistors.

10. The nonvolatile memory device of claim 1, wherein the common source line driver further comprises:
a ramping code generator adapted to generate a set code for selectively stepwise increasing and decreasing a voltage level of the common source line; and
a first reference voltage generator adapted to output the reference voltage based upon the set code.

11. The nonvolatile memory device of claim 1, wherein the common source line recovery period is equal to or shorter than about 4 us after a program execution period.

12. A nonvolatile memory device comprising:
a memory cell array including a plurality of memory blocks each having memory cells coupled with bit lines, word lines and a common source line;
an input/output circuit adapted to store data to be programmed at memory cells coupled to a selected one of the word lines of a selected memory block, of the plurality of memory blocks, for a program operation and store data read from the memory cells coupled to the selected word line for a verification operation;
a common source line driver adapted to set the common source line with a preset voltage, and, selectively drain charge from and supply charge to the common source line using a voltage level of the common source line as a feedback signal; and
control logic adapted to control the input/output circuit and the common source line driver for the program operation and the verification operation;
wherein the common source line driver stepwise decreases a voltage level of the common source line during a common source line recovery period.

13. The nonvolatile memory device of claim 12, wherein the common source line driver selectively supplies charge to and drains charge from the common source line as a difference between the preset voltage and the voltage level of the common source line.

14. The nonvolatile memory device of claim 12, wherein the common source line driver comprises:
a differential amplifier adapted to amplify a reference voltage to adjust the voltage level of the common source line; and
a common source line level control unit including a pull-up unit adapted to supply charge to the common source line and a pull-down unit adapted to drain charge from the common source line.

15. The nonvolatile memory device of claim 14, wherein an output terminal of the differential amplifier is electrically coupled to the common source line.

16. The nonvolatile memory device of claim 14, wherein the pull-up unit comprises a first enable transistor and a first control transistor connected in series between a second voltage node, supplied with a second voltage, and the common source line; and wherein the pull-down unit comprises a second enable transistor and a second control transistor connected in series between the common source line and a ground.

17. A method of programming a nonvolatile memory device which includes a plurality of strings formed between bit lines and a common source line in a direction perpendicular to a substrate, the method comprising:
setting up the common source line with a preset voltage;
selectively supplying charge to and draining charge from the common source line using a voltage level of the common source line as a feedback signal, including
determining whether the voltage level of the common source line varies,
as a consequence of determining that the voltage level of the common source line varies, determining whether the voltage level of the common source line is higher than the preset voltage,
draining charge from the common source line when the voltage level of the common source line is higher than the preset voltage, and
supplying charge to the common source line when the voltage level of the common source line is lower than the preset voltage;
programming memory cells connected to a selected word line; and
performing a verification operation of the memory cells.

18. The method of claim 17, wherein selectively supplying charge to and draining charge from the common source line using the voltage level of the common source line as the feedback signal further comprises:
maintaining the voltage level of the common source line when the voltage level of the common source line does not vary; and
determining whether programming the memory cells is ended; and
wherein the verification operation is performed when programming the memory cells is ended, and whether a voltage level of the common source line varies is determined when programming the memory cells is not ended.

* * * * *